(12) United States Patent
Liang et al.

(10) Patent No.: US 11,513,152 B2
(45) Date of Patent: Nov. 29, 2022

(54) TESTING DEVICE AND METHOD

(71) Applicant: SILICONWARE PRECISION INDUSTRIES CO., LTD., Taichung (TW)

(72) Inventors: Wen-Chin Liang, Taichung (TW); Po-Wen Hsiao, Taichung (TW); Cheng-Tsai Hsieh, Taichung (TW); Cheng-Shao Chen, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 37 days.

(21) Appl. No.: 17/167,608

(22) Filed: Feb. 4, 2021

(65) Prior Publication Data
US 2022/0196731 A1   Jun. 23, 2022

(30) Foreign Application Priority Data

Dec. 21, 2020  (TW) ................. 109145278

(51) Int. Cl.
*G01R 1/04*   (2006.01)
*G01R 1/067*  (2006.01)
*G01R 1/073*  (2006.01)
*G01R 31/28*  (2006.01)
*G01R 31/319* (2006.01)

(52) U.S. Cl.
CPC ......... *G01R 31/2886* (2013.01); *G01R 1/067* (2013.01); *G01R 31/31901* (2013.01)

(58) Field of Classification Search
CPC .......... G01R 1/04; G01R 1/067; G01R 1/073; G01R 31/28; G01R 31/2851; G01R 31/2886; G01R 31/2887; G01R 31/2889; G01R 31/31; G01R 31/318511; G01R 31/31901
See application file for complete search history.

(56) References Cited

U.S. PATENT DOCUMENTS

| | | | |
|---|---|---|---|
| 5,585,738 A * | 12/1996 | Kuji .................... | G01R 1/07314 324/750.19 |
| 9,857,413 B2 * | 1/2018 | Farr .................... | G01R 31/2822 |
| 2006/0114008 A1 * | 6/2006 | Fujii .................... | G01R 31/2886 324/756.07 |
| 2011/0254574 A1 * | 10/2011 | Tashiro .............. | G01R 31/2887 324/762.01 |

* cited by examiner

*Primary Examiner* — Neel D Shah
(74) *Attorney, Agent, or Firm* — Kelly & Kelley, LLP (57) ABSTRACT

Provided is a testing method including: disposing a wafer on a working platform of a testing device; and moving a circuit board of the testing device relative to the working platform by a movement assembly of the testing device so as to allow at least two testing ports of the circuit board to test two chips of the wafer, respectively. Further, the two testing ports have different testing functions. Therefore, during the wafer testing process, a single testing device can perform multiple testing operations.

16 Claims, 8 Drawing Sheets

TESTING DEVICE AND METHOD

CROSS-REFERENCE TO RELATED APPLICATIONS

This application claims priority to Taiwan Application Serial No. 109145278, filed on Dec. 21, 2020. The entirety of the application is hereby incorporated by reference herein and made a part of this application.

BACKGROUND

1. Technical Field

The present disclosure relates to electrical testing devices, and more particularly, to a testing device and a testing method applicable to probe cards.

2. Description of Related Art

Currently, a variety of electrical tests need to be performed in feeding of a wafer so as to determine the quality level of each chip of the wafer.

However, in current testing machines and corresponding probe cards, a single testing station can only perform one electrical test. If the wafer under test needs to undergo a plurality of electrical tests, it is necessary to set up a plurality of testing stations so as to complete the wafer feeding inspection. As such, the cost for purchasing machines is increased, thus greatly increasing the process cost and time of the wafer.

Further, each time a testing station completes an electrical test, a piece of data is obtained. After the wafer passes through a plurality of testing stations, a plurality of pieces of data are stored in a database for use in a subsequent process of the wafer.

However, to use the plurality of pieces of data in the subsequent process of the wafer, the data need to be retrieved from the database and integrated. If the operations of data retrieving and integration are performed multiple times, the subsequent process of the wafer will be seriously affected, thus resulting in a capacity bottleneck.

Therefore, how to overcome the above-described drawbacks of the prior art has become an urgent issue in the art.

SUMMARY

In view of the above-described drawbacks, the present disclosure provides a testing device, which comprises: a working platform for disposing a plurality of objects; a circuit board having a plurality of testing ports, wherein the plurality of testing ports have different testing functions; and a movement assembly for moving the circuit board relative to the working platform to allow the plurality of testing ports to test the different objects on the working platform.

The present disclosure further provides a testing method, which comprises: disposing a plurality of objects on a working platform; and moving a circuit board having a plurality of testing ports relative to the working platform by a movement assembly to allow the plurality of testing ports to test different objects on the working platform, wherein the plurality of testing ports have different testing functions.

The above-described testing device and testing method can further comprise integrating test results of the plurality of testing ports for a single one of the objects into a quality level of the objects. For example, an analysis and processing device communicatively connected to the circuit board integrates the test results of the plurality of testing ports for the single one of the objects into the quality level of the objects.

In the above-described testing device and testing method, at least two of the plurality of testing ports are arranged side by side and spaced from or adjacent to one another.

In the above-described testing device and testing method, the plurality of objects are arranged in an array, and at least two of the plurality of testing ports correspond to the objects of different rows and are arranged diagonally.

In the above-described testing device and testing method, an axial distance between centers of at least two of the plurality of testing ports is a width of n objects, and n is a positive integer.

In the above-described testing device and testing method, the plurality of objects are arranged in an array, and the movement assembly has a movement path of an S-like shape based on rows of the array.

In the above-described testing device and testing method, the plurality of objects are arranged in an array, and the movement assembly has a movement path in a same direction based on rows of the array.

In the above-described testing device and testing method, the movement assembly moves the circuit board in multi-axial directions based on the working platform.

According to the above-described testing device and testing method, in a single testing device, a single circuit board is provided with a plurality of testing ports so as to simultaneously perform different function tests on a plurality of objects. Therefore, compared with the prior art, the present disclosure can perform multiple testing operations with a single testing device so as to save testing stations, thereby greatly reducing the cost for purchasing machines and the process cost of the objects, increasing the plant utilization, greatly shortening the overall process time of the objects and increasing the production capacity.

Further, each time a single testing port completes a test on an object, information related to the test result is temporarily stored. After the object is tested by all testing ports of the circuit board, the information related to multiple test results of the single testing device can be quickly integrated so as to output a piece of integrated information for use in a subsequent process of the object. As such, compared with the prior art, in the subsequent process of the present disclosure, if required for applying the information related to the test results, the integrated information can be obtained immediately without the need to retrieve data from a database or integrate data as in the prior art, thereby accelerating the subsequent process of the object and greatly increasing the production capacity.

BRIEF DESCRIPTION OF THE DRAWINGS

FIG. 1' is a schematic upper plan view of objects of FIG. 1.

DETAILED DESCRIPTION

The following illustrative embodiments are provided to illustrate the present disclosure, these and other advantages and effects can be apparent to those skilled in the art after reading this specification.

It should be noted that all the drawings are not intended to limit the present disclosure. Various modifications and variations can be made without departing from the spirit of the present disclosure. Further, terms such as "first," "second," "third," "on," "a," etc., are merely for illustrative purposes and should not be construed to limit the scope of the present disclosure.

Figure 1:
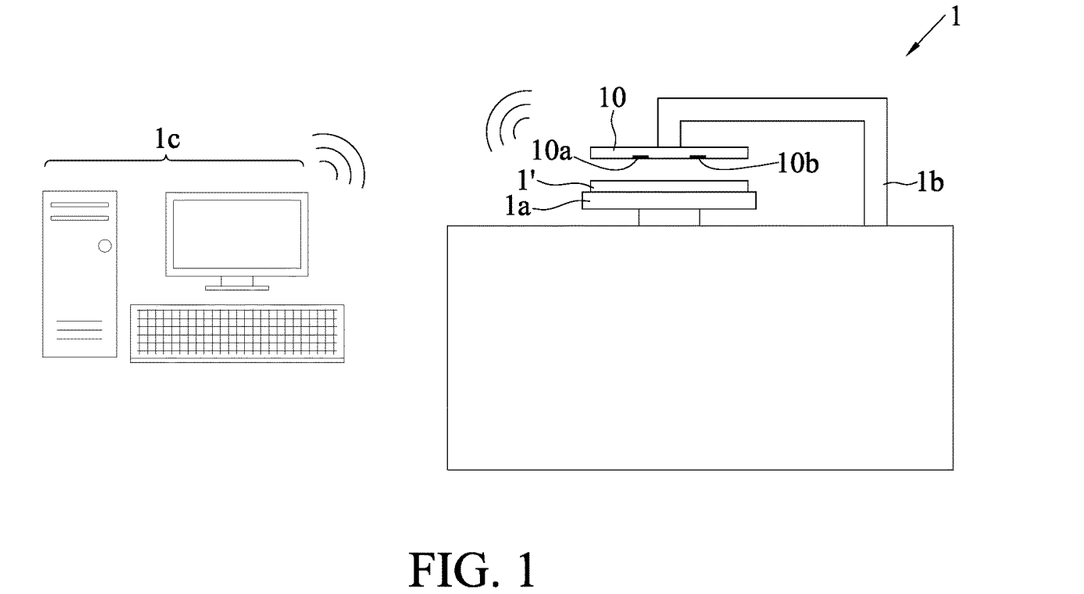
FIG. 1 is a schematic front plan view of a testing device according to the present disclosure.

FIG. 1 is a schematic view of a testing device 1 according to the present disclosure. In an embodiment, the testing device 1 is used for testing the electrical function of a wafer 1' having a plurality of objects 9 (as shown in FIG. 1').

Referring to FIG. 1, the testing device 1 has: a working platform 1a, a circuit board 10 and a movement assembly 1b for moving the circuit board 10.

In an embodiment, the testing device 1 is a probe machine (prober) for disposing the plurality of objects 9 on the working platform 1a.

Further, each of the objects 9 is a chip of an optical trans-impedance amplifier (TIA), and the plurality of objects 9 are arranged in an array and constitute the wafer 1' (not singulated, as shown in FIG. 1').

The circuit board 10 has a plurality of testing ports. In an embodiment, referring to FIG. 2A, the circuit board 10 has a first testing port 10a and a second testing port 10b for testing different functions. For example, the first testing port 10a is used for testing DC voltage and current, and the second testing port 10b is used for testing high-frequency or high-speed radio frequency (RF) performance.

In an embodiment, the circuit board 10 can be a board that can be used by a testing machine, such as a probe card for testing a wafer/chip or a load board for testing a package. The first testing port 10a is configured with a plurality of first probe structures 11, and the second testing port 10b is configured with the plurality of first probe structures 11 and a plurality of second probe structures 12. For example, both the first testing port 10a and the second testing port 10b have an opening, and the opening profiles of the first testing port 10a and the second testing port 10b can be identical (e.g., rectangular shapes of FIG. 2A) or different.

Figure 2A:
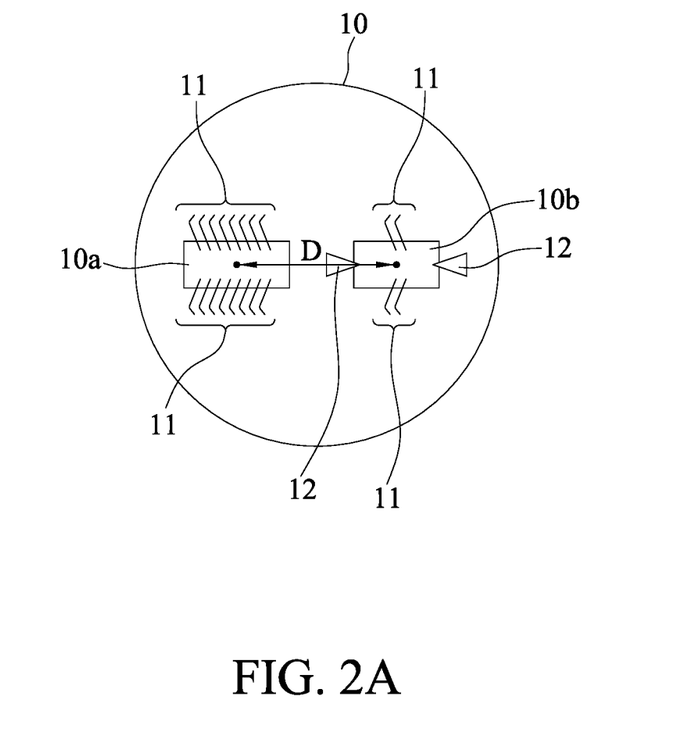
FIG. 2A is a schematic upper plan view of a circuit board of FIG. 1.

Furthermore, the structure and use of the first probe structures 11 are different from those of the second probe structures 12. For example, each of the first probe structures 11 has a cantilever probe structure for testing DC voltage and current of the objects 9, and each of the second probe structures 12 has a RF probe structure for testing high-frequency or high-speed performance of the objects 9. Further, the plurality of second probe structures 12 of the second testing port 10b can be arranged in ground-signal-ground (GSG), GSSG, GSGSG or other styles based on electrical contacts of the objects 9, and the second testing port 10b only needs a small number of first probe structures 11 as DC bias probes for supplying power.

Figure 2B:
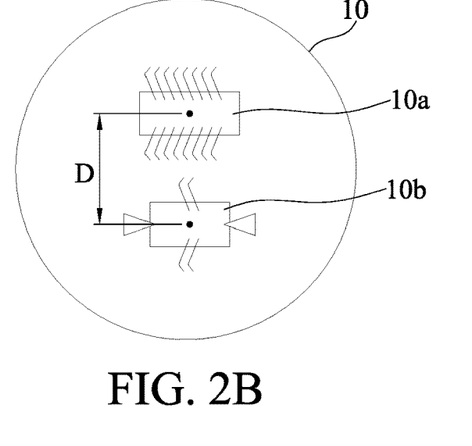
FIGS. 2B, 2C and 2D are schematic upper plan views showing other aspects of FIG. 2A.
Figure 2C:
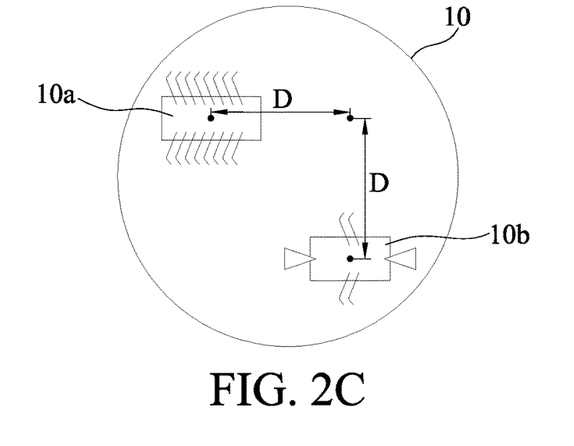

Further, the plurality of objects 9 are arranged in an array, and the opening profiles of the first testing port 10a and the second testing port 10b are rectangles. As such, the first testing port 10a and the second testing port 10b can be arranged in a left-right (as shown in FIG. 2A) or front-rear (as shown in FIG. 2B) direction so as to correspond to the objects 91, 93 in the same row (as shown in FIG. 3C). Alternatively, the first testing port 10a and the second testing port 10b can be disposed diagonally (as shown in FIG. 2C) so as to correspond to the objects 9 in different rows (as shown in an imaginary line of FIG. 3D).

The movement assembly 1b is used for fixing the circuit board 10 so as to axially move the circuit board 10 in front, rear, left, right, up and down directions based on the working platform 1a.

In an embodiment, the movement assembly 1b can be a mechanical arm, a plurality of axially sliding members or other suitable mechanisms. The movement assembly 1b moves the circuit board 10 to a suitable position so as for the first probe structures 11 and the second probe structures 12 to simultaneously contact the electrical contacts of different objects 9, 9', respectively. For example, in a single testing operation, the circuit board 10 can simultaneously complete different function tests of two objects 9, 9'.

Figure 2D:
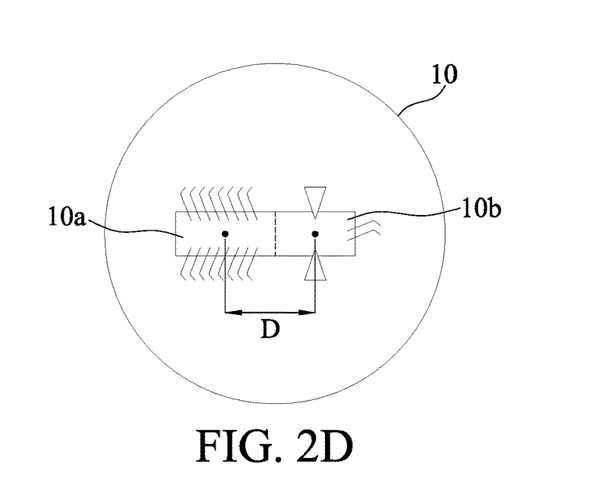

Therefore, the first testing port 10a and the second testing port 10b should correspond in position to the objects 9, 9'. For example, the axial distance D between the center of the first testing port 10a and the center of the second testing port 10b is a width of n objects 9" (as shown in FIGS. 1' and 2A, each object has a width W, and D=nW). Therein, n is a positive integer. It can be understood that when the axial distance between the first testing port 10a and the second testing port 10b is the width W of a single object 9", the two testing ports are arranged adjacent to one another (as shown in FIG. 2D). As such, the circuit board 10 can simultaneously complete different function tests of two adjacent objects 9 and 9".

Further, the circuit board 10 is moved by the movement assembly 1b so as to perform multiple (e.g., two) testing operations on each object 9, 9'.

Furthermore, the testing device 1 further includes an analysis and processing device 1c (e.g., a computer) communicatively connected to the circuit board 10 for integrating test results of the plurality of testing ports for a single object 9. Therefore, referring to FIG. 1', after each object 9, 9', 9" is tested by the plurality of testing ports (e.g., the first testing port 10a and the second testing port 10b), the analysis and processing device 1c performs a test result integration operation so as to integrates at least two test results (e.g., DC and RF performance) of the single object 9, 9', 9" into a piece of integrated information. The integrated information contains the quality level of the object 9, 9', 9" (e.g., a bin code signal).

FIGS. 3A to 3D are schematic partial upper views illustrating a testing method according to the present disclosure. In an embodiment, referring to FIGS. 3A to 3D in combination with FIGS. 1 and 2A, the testing method is performed by the testing device 1.

Figure 3A:
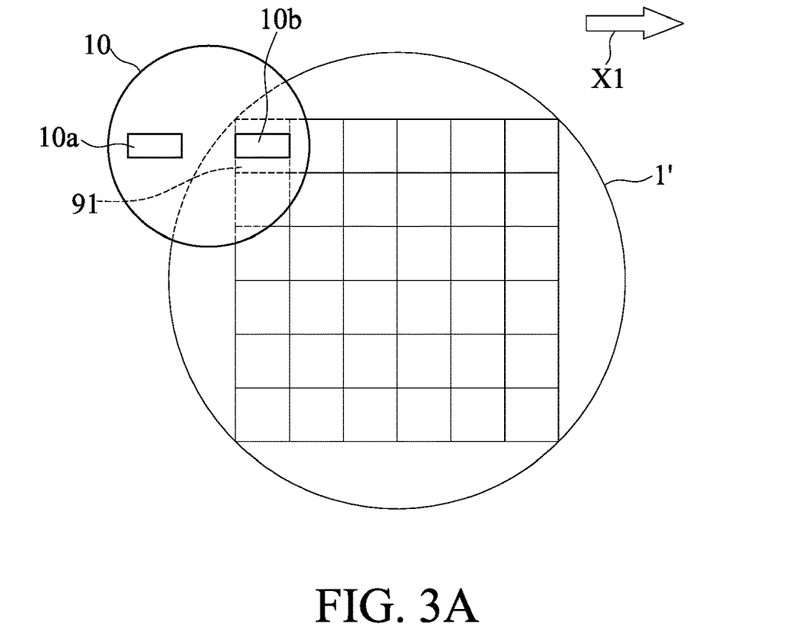
FIGS. 3A to 3D are schematic flow diagrams illustrating a testing method according to the present disclosure.

Referring to FIG. 3A, the wafer 1' is disposed on the working platform 1a, and the movement assembly 1b moves the circuit board 10 to a suitable position so as to align the second testing port 10b with an object 91 at a first position of the wafer 1', thus causing the second probe structures 12 to contact the object 91 at the first position so as to perform a high-frequency or high-speed performance test on the object 91 at the first position.

In an embodiment, the axial distance D between the first testing port 10a and the second testing port 10b is the width of at least one object (as shown in FIG. 3C, the axial distance D is the width of two objects). Therefore, the first testing port 10a is positioned at an outer peripheral region of the wafer 1'.

Further, after the test on the object 91 at the first position is completed, the circuit board 10 outputs a RF performance test result (defined as a second test result) of the object 91 at the first position to the analysis and processing device 1c.

Figure 3B:
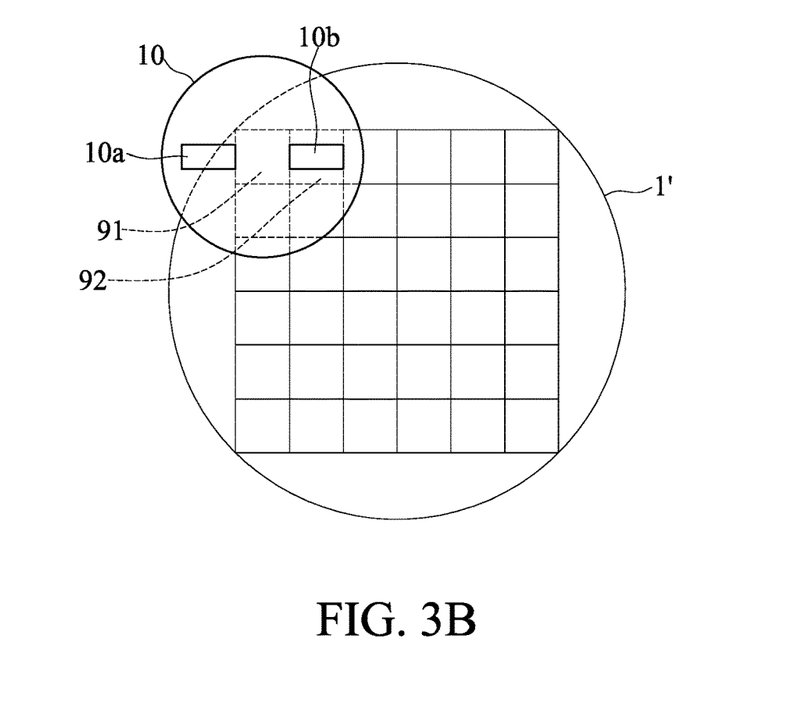
Figure 3C:
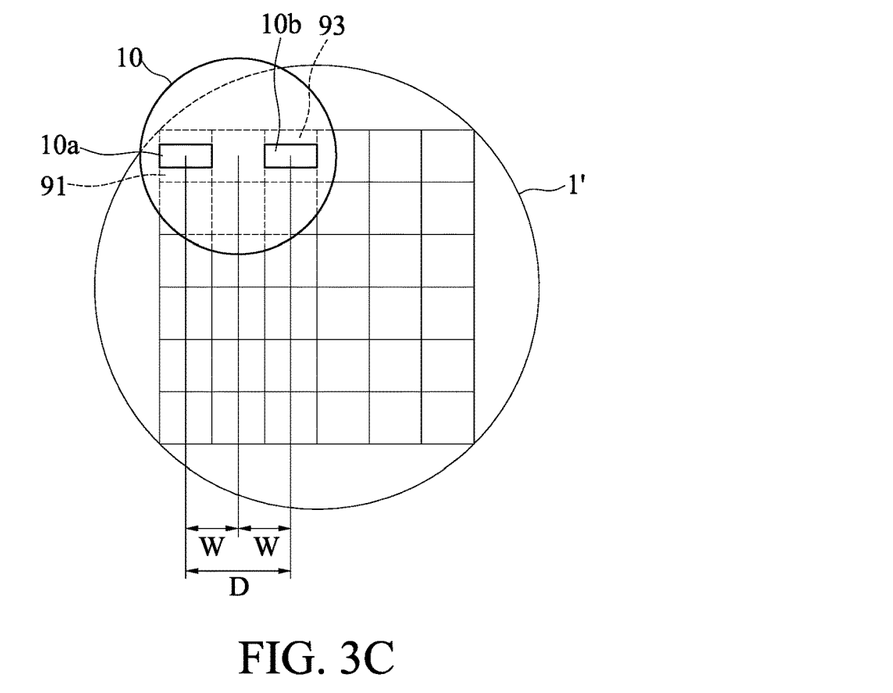

Referring to FIG. 3B, after the second probe structures 12 complete the testing operation on the object 91 at the first position, the movement assembly 1b linearly and laterally moves the circuit board 10 (in an arrow direction X1 of FIG. 3A) so as to align the second testing port 10b with an object 92 at a second position of the wafer 1', thereby causing the second probe structures 12 to perform a high-frequency or high-speed performance test on the object 92 at the second position. At this time, the first testing port 10a is still positioned at an outer peripheral region of the wafer 1'.

Similarly, after the object 92 at the second position is tested, the circuit board 10 outputs a RF performance test result (defined as a second test result) of the object 92 at the second position to the analysis and processing device 1c.

Referring to FIG. 3C, after the second probe structures 12 complete the testing operation on the object 92 at the second position, the movement assembly 1b linearly and laterally moves the circuit board 10 to a suitable position so as to align the second testing port 10b with an object 93 at a third position of the wafer 1', thereby causing the second probe structures 12 to perform a high-frequency or high-speed performance test on the object 93 at the third position. At this time, the first testing port 10a is aligned with the object 91 at the first position of the wafer 1' so as to cause the first probe structures 11 to contact the object 91 at the first position and perform a DC voltage and current performance test on the object 91 at the first position.

In an embodiment, after the object 91 at the first position is tested by the first testing port 10a, the circuit board 10 outputs a DC performance test result (defined as a first test result) of the object 91 at the first position to the analysis and processing device 1c. When the analysis and processing device 1c determines that the object 91 at the first position has obtained the first test result and the second test result, the analysis and processing device 1c integrates the first test result and the second test result of the object 91 at the first position so as to generate a bin code signal indicating the quality level of the object 91 at the first position.

Figure 3D:
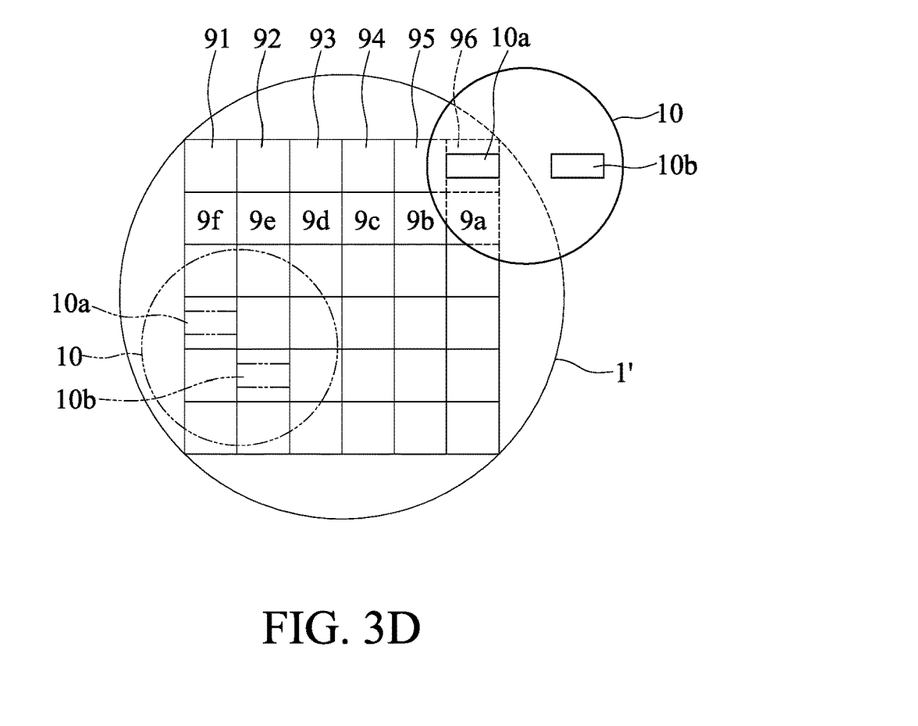

Referring to FIG. 3D, after the first probe structures 11 complete the testing operation on the object 91 at the first position and the second probe structures 12 complete the testing operation on the object 93 at the third position, the movement assembly 1b linearly and laterally moves the circuit board 10 so as to allow the first testing port 10a and the second testing port 10b to sequentially test objects 91, 92, 93, 94, 95, 96 at different positions of the wafer 1'. Therefore, after the first testing port 10a completes the DC test on the object 96 at the last (sixth) position of the first row of the wafer 1', i.e., the testing operations on the objects 91, 92, 93, 94, 95, 96 at different positions of the first row of the wafer 1' are completed, the second testing port 10b is positioned at an outer peripheral region of the wafer 1', and the analysis and processing device 1c generates the quality levels of the objects 91, 92, 93, 94, 95, 96 at different positions of the wafer 1' through integration.

Figure 4A:
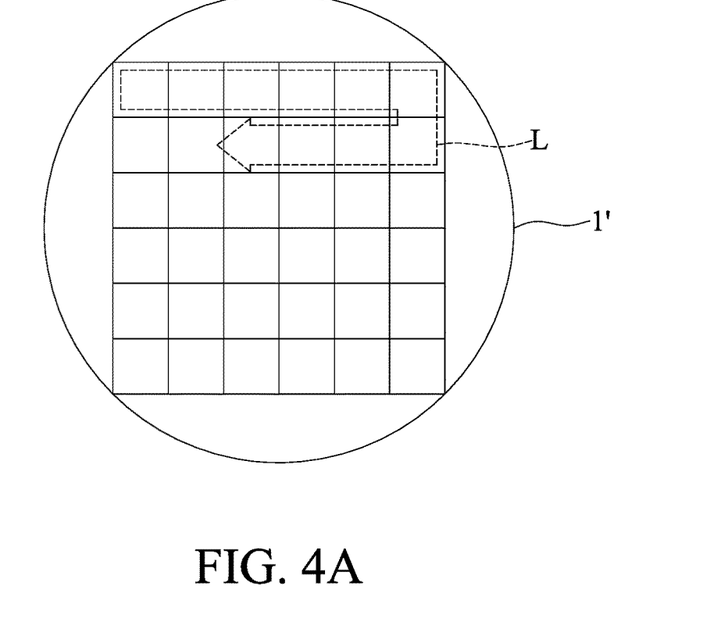
FIGS. 4A to 4D are schematic upper plan views showing different embodiments of a movement path of a movement assembly of the testing device according to the present disclosure.
Figure 4B:
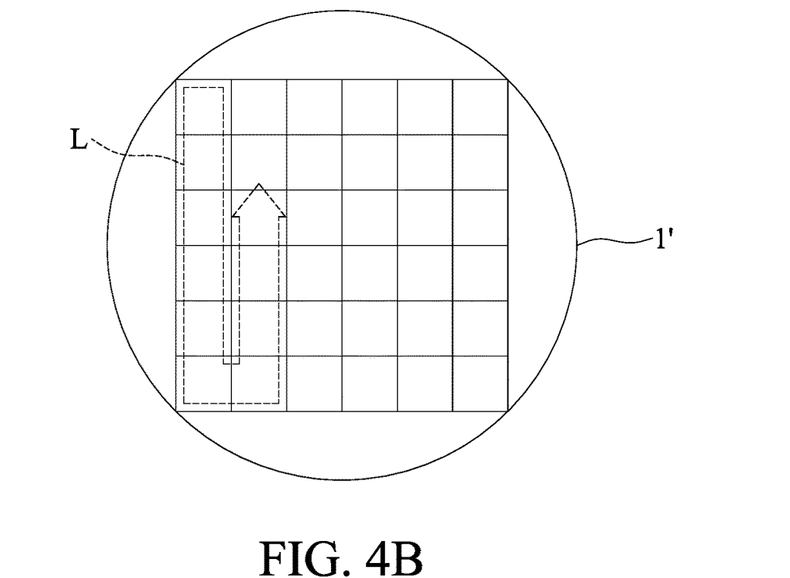
Figure 4C:
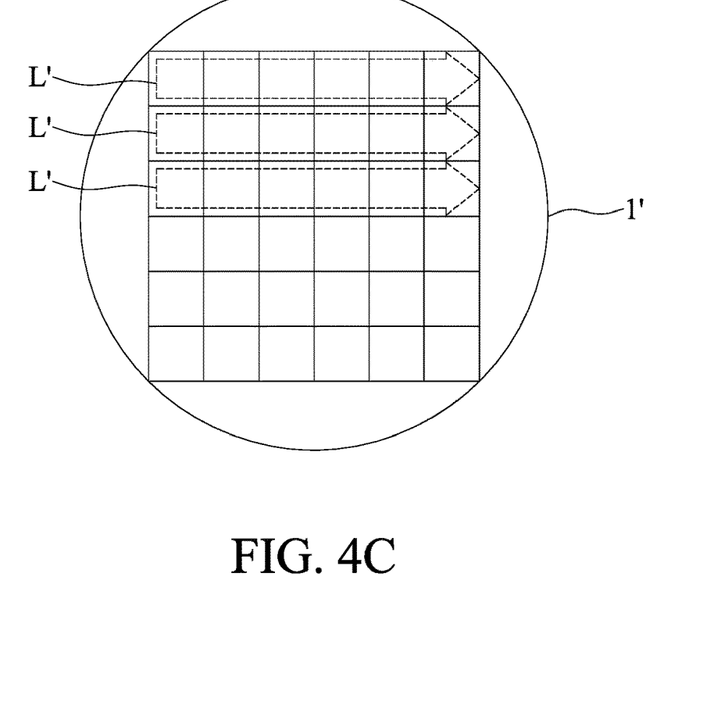
Figure 4D:
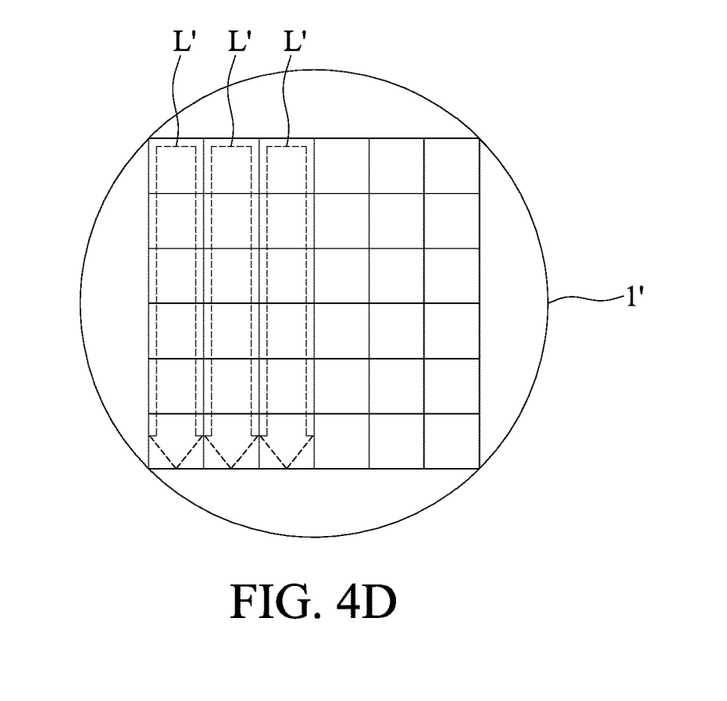

In an embodiment, referring to FIG. 4A, the movement assembly 1b has a movement path L of an S-like shape based on the rows of the array of the objects 9. Therefore, referring to FIG. 3D, after the testing operations are performed along the movement path L from left to right, the testing operations on the second row of the wafer 1' will be performed from right to left along the movement path L of the movement assembly 1b. That is, the objects 9a, 9b, 9c, 9d, 9e, 9f are tested sequentially. Further, referring to FIGS. 4A to 4D, according to requirements, the movement path L, L' of the movement assembly 1b can be designed to have an S-like shape as shown in FIGS. 4A and 4B or have the same direction as shown in FIGS. 4C and 4D. Furthermore, the movement path L, L' can be irregular, but the present disclosure is not limited to as such.

Accordingly, in the testing method according to the present disclosure, on a single testing device 1, a single circuit board 10 is provided with at least two testing ports (e.g., a first testing port 10a and a second testing port 10b) so as to simultaneously perform different function tests on at least two objects 9, 9'. Therefore, compared with the prior art, the present disclosure can perform multiple testing operations with a single testing station (e.g., the testing device 1) so as to save testing stations, thereby greatly reducing the cost for purchasing machines and the process cost of the wafer 1', increasing the plant utilization, greatly shortening the overall process time of the wafer 1' and increasing the production capacity.

Further, in the testing method according to the present disclosure, each time a single testing port (e.g., the first testing port 10a or the second testing port 10b) completes a test on an object 9, 9', information related to the test result is temporarily stored in the analysis and processing device 1c. After the object 9, 9' is tested by all testing ports of the circuit board 10, the analysis and processing device 1c can integrate the information related to multiple test results of the single testing station (e.g., the testing device 1) quickly so as to output a piece of integrated information containing a quality level signal for use in a subsequent process of the wafer 1'. As such, compared with the prior art, in the subsequent process of the wafer 1' according to the present disclosure, if required applying the information related to the test results, the integrated information can be obtained immediately from the analysis and processing device 1c without the need to retrieve data from a database or integrate data as in the prior art, thus accelerating the subsequent process of the wafer 1' and greatly increasing the production capacity.

Figure 5:
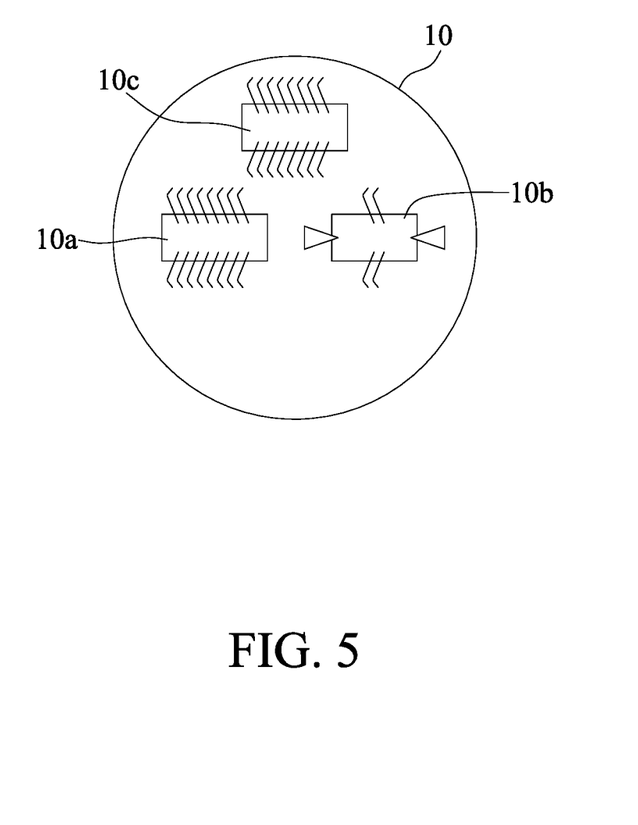
FIG. 5 is a schematic partial upper plan view showing another embodiment of the testing device according to the present disclosure.

It should be understood that the circuit board 10 can be provided with more testing ports according to requirements. For example, referring to FIG. 5, the circuit board 10 has a first testing port 10a, a second testing port 10b and a third testing port 10c. Therein, the third testing port 10c is used for testing low frequency performance so as to improve the testing efficiency of a single testing station (e.g., the testing device 1) and hence improve the overall testing efficiency for a single object 9 (e.g., a single conventional chip needs to pass through ten testing stations, while the object 9 of the present disclosure only needs to pass through three to four testing stations). Therefore, the testing ports of the circuit board 10 is at least two, but the present disclosure is not limited to as such.

According to the testing device and the testing method of the present disclosure, the circuit board of the testing device is provided with a plurality of testing ports so as to simultaneously perform different function tests on a plurality of objects. Therefore, compared with the prior art, the present disclosure can perform multiple testing operations with a single testing device so as to save testing stations, thereby greatly reducing the cost for purchasing machines and the process cost of the objects, increasing the plant utilization, greatly shortening the overall process time of the objects and increasing the production capacity.

Further, each time a single testing port completes a test on an object, information related to the test result is temporarily stored in the analysis and processing device. After the object is tested by all testing ports of the circuit board, the information related to multiple test results of the testing device can be quickly integrated so as to output a piece of integrated information for use in a subsequent process of the object. As such, in the subsequent process, if required applying the information related to the test results, the integrated information can be obtained immediately, thus accelerating the subsequent process of the object and greatly increasing the production capacity.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. A testing device, comprising:
    a working platform for disposing a plurality of objects;
    a circuit board having a plurality of testing ports, wherein the plurality of testing ports have different testing functions;
    a movement assembly for moving the circuit board relative to the working platform to allow the plurality of testing ports to test the plurality of objects on the working platform; and
    an analysis and processing device communicatively connected to the circuit board for integrating test results of the plurality of testing ports for a single one of the objects.

2. The testing device of claim 1, wherein the analysis and processing device integrates the test results of the plurality of testing ports for the single one of the objects into a quality level of the objects.

3. The testing device of claim 1, wherein at least two of the plurality of testing ports are arranged side by side and spaced from or adjacent to one another.

4. The testing device of claim 1, wherein the plurality of objects are arranged in an array, and at least two of the plurality of testing ports correspond to the objects of different rows and are arranged diagonally.

5. The testing device of claim 1, wherein an axial distance between centers of at least two of the plurality of testing ports is a width of n objects, and n is a positive integer.

6. The testing device of claim 1, wherein the plurality of objects are arranged in an array, and the movement assembly has a movement path of an S-like shape based on rows of the array.

7. The testing device of claim 1, wherein the plurality of objects are arranged in an array, and the movement assembly has a movement path in a same direction based on rows of the array.

8. The testing device of claim 1, wherein the movement assembly moves the circuit board in multi-axial directions based on the working platform.

9. A testing method, comprising:
    disposing a plurality of objects on a working platform;
    moving a circuit board having a plurality of testing ports relative to the working platform by a movement assembly to allow the plurality of testing ports to test different objects on the working platform, wherein the plurality of testing ports have different testing functions; and
    integrating test results of the plurality of testing ports for a single one of the objects.

10. The testing method of claim 9, further comprising integrating the test results of the plurality of testing ports for the single one of the objects into a quality level of the objects.

11. The testing method of claim 9, wherein at least two of the plurality of testing ports are arranged side by side and spaced from or adjacent to one another.

12. The testing method of claim 9, wherein the plurality of objects are arranged in an array, and at least two of the plurality of testing ports correspond to the objects of different rows and are arranged diagonally.

13. The testing method of claim 9, wherein an axial distance between centers of at least two of the plurality of testing ports is a width of n objects, and n is a positive integer.

14. The testing method of claim 9, wherein the plurality of objects are arranged in an array, and the movement assembly has a movement path of an S-like shape based on rows of the array.

15. The testing method of claim 9, wherein the plurality of objects are arranged in an array, and the movement assembly has a movement path in a same direction based on rows of the array.

16. The testing method of claim 9, wherein the movement assembly moves the circuit board in multi-axial directions based on the working platform.

* * * * *